(12) United States Patent
Ashokkumar et al.

(10) Patent No.: US 7,505,303 B2
(45) Date of Patent: Mar. 17, 2009

(54) METHOD AND APPARATUS TO CREATE AN ERASE DISTURB ON A NON-VOLATILE STATIC RANDOM ACCESS MEMORY CELL

(75) Inventors: Jayant Ashokkumar, Colorado Springs, CO (US); David W. Still, Colorado Springs, CO (US); James D. Allan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 250 days.

(21) Appl. No.: 11/644,447

(22) Filed: Dec. 22, 2006

(65) Prior Publication Data

US 2008/0151643 A1  Jun. 26, 2008

(51) Int. Cl.
  *G11C 11/00* (2006.01)
(52) U.S. Cl. .................................. 365/154; 365/185.07
(58) Field of Classification Search ................. 365/154, 365/185.07, 185.25
  See application file for complete search history.

(56) References Cited

U.S. PATENT DOCUMENTS

| | | | | |
|---|---|---|---|---|
| 5,065,362 A | * | 11/1991 | Herdt et al. | 365/154 |
| 5,602,776 A | * | 2/1997 | Herdt et al. | 365/185.08 |
| 7,020,007 B2 | * | 3/2006 | Kwon | 365/154 |
| 2006/0023503 A1 | * | 2/2006 | Lee | 365/185.05 |

OTHER PUBLICATIONS

SIMTEK, nvSRAM Basics, www.simtek.com/attachments/AppNote01.pdf.

* cited by examiner

*Primary Examiner*—Vu A Le

(57) ABSTRACT

A system and method for disturbing an erased memory location structure in a non-volatile portion of a semiconductor memory is disclosed. The present invention applies a voltage to a first memory location of a non-volatile portion of the semiconductor memory that is in a programmed state and a second memory location of a non-volatile portion of the semiconductor memory that is in an erased state so as to keep the first memory location programmed and to transition the second memory location from a programmed state to an erased state.

3 Claims, 7 Drawing Sheets

METHOD AND APPARATUS TO CREATE AN ERASE DISTURB ON A NON-VOLATILE STATIC RANDOM ACCESS MEMORY CELL

BACKGROUND OF THE INVENTION

1. Field of the Invention

The present invention is generally directed to memory, and more particularly to implementing an erase disturb on a non-volatile Static Random Access Memory (SRAM) cell.

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

In a typical nvSRAM cell operation, one side of the trigate gets programmed while the other side remains erased or write inhibited. A method would be useful for disturbing the erase SONOS transistor to see the extent to which it gets programmed while maintaining the program SONOS transistor in a programmed state. In an array of 1 Mb to 4 Mb cells, there might be some tail bits, which may have their erased SONOS threshold's slightly more positive than expected and this may cause the SONOS window for the program SONOS transistor and the erase SONOS transistor to be small. A method to determine the extent of the erase SONOS transistor will be helpful to determine the SONOS window for the program SONOS transistor threshold voltage and the erase SONOS transistor threshold voltage especially on the tail bits in an array of 1 Mb to 4 Mb nvSRAM cells.

It would be advantageous to provide a method and apparatus for creating an erase disturb on a nvSRAM cell by eliminating the need to write the opposite state in the volatile portion of the nvSRAM so as to create a disturb on the erased SONOS transistor in the non-volatile portion.

BRIEF SUMMARY OF THE INVENTION

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements In one embodiment, a method in the non-volatile section of a non-volatile SRAM for disturbing a first tri-gate structure in an erased condition while a second tri-gate structure remains programmed is provided. The non-volatile SRAM cell has a volatile portion and a non-volatile portion. Each tri-gate structure in the non-volatile portion has a recall transistor, a store transistor and at least one SONOS transistor. The volatile portion has a SRAM cell comprising 6 transistors with two back-to-back inverters forming the latch and two pass transistors gated by the word-line signal which connect the bit-line true to the data true node of the latch and the bit-line complement to the data complement node of the latch, a word line, a node supplying power to the SRAM cell and a bit line pair with a first bit line and a second bit line. The first and second SONOS transistors are programmed so that the first tri-gate having the first SONOS transistor is configured in an erased condition and the second tri-gate structure having the second SONOS transistor is configured in a programmed condition. The volatile portion is isolated from the non-volatile portion by turning off a first store transistor in the first tri-gate structure and turning off a second store transistor in the second tri-gate structure.

A programming pulse and a programming voltage are applied to the first and second SONOS transistors in the first and second tri-gate structures. A voltage is then applied to each recall transistor in the first and second tri-gate structure sufficient to turn each recall transistor on. Finally, the supply voltage to the first and second tri-gate structure is ramped from a first voltage to approximately ground, so that the second tri-gate structure remains in a programmed condition and the first tri-gate structure transitions from an erased condition to a programmed condition and gets disturbed.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A system and method for disturbing the erase memory location in a non-volatile SRAM is disclosed.

Figure 1:
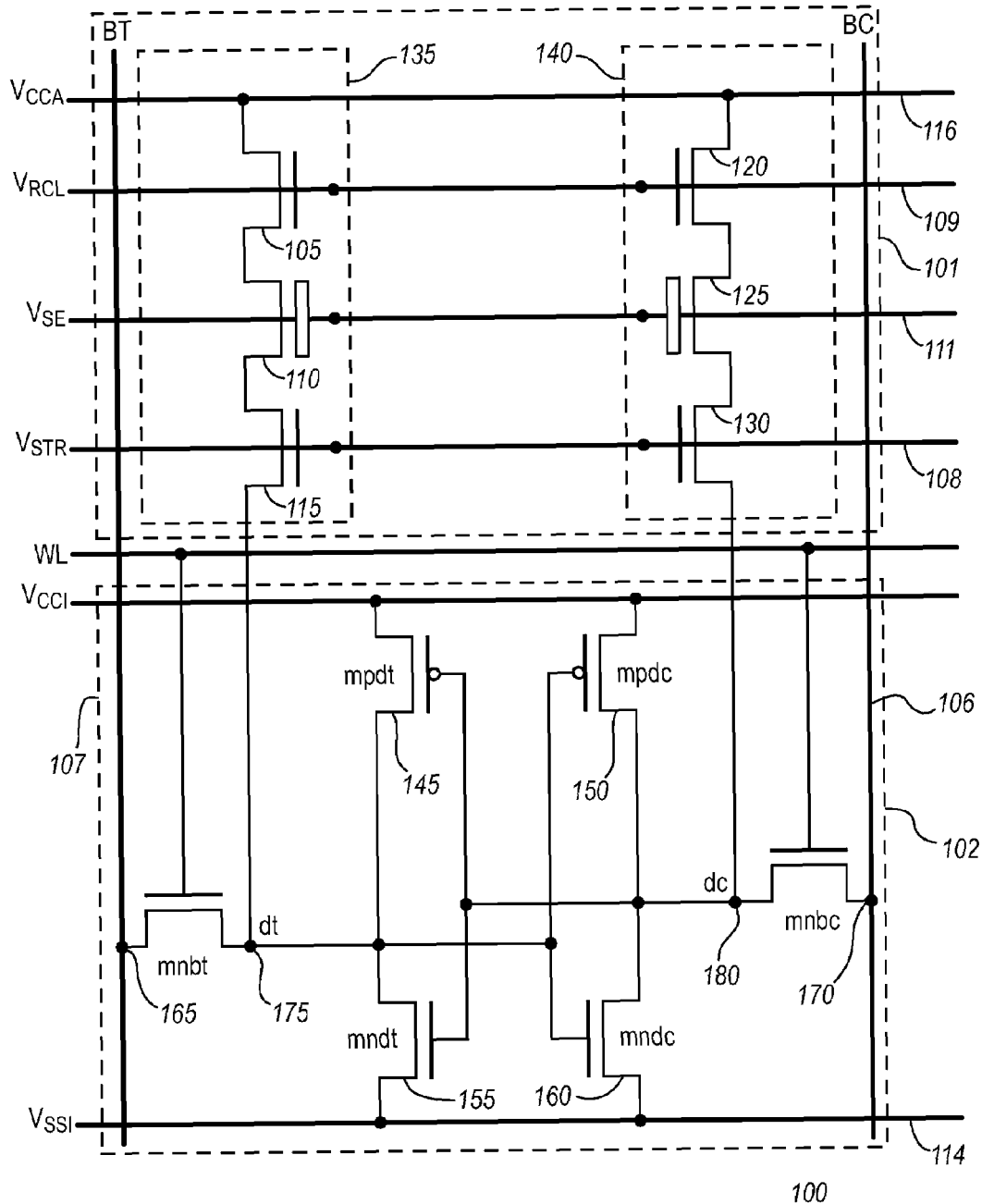
FIG. 1 is a schematic diagram illustrating an nvSRAM memory cell in accordance with one embodiment of the present invention.

FIG. 1 illustrates a typical nvSRAM cell 100 with a single SRAM and a series-connected, non-volatile memory cell, hereinafter referred to as nvSRAM device 100 in accordance with the following invention. While the nvSRAM device 100 is illustrated as having a single nvSRAM memory cell (in this case, the single SRAM and a single non-volatile memory cell), it should be appreciated that an nvSRAM device typically includes a plurality of nvSRAM cells that are integrated with a controller onto a single semiconductor chip to form an array.

A basic nvSRAM cell 100 is comprised of a static random access memory (SRAM) cell 102 that is capable of communicating a bit of data to and from an exterior environment and a non-volatile (nv) cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The nv cell 101 prevents loss of the bit of data by providing the capability to receive the bit of data from the SRAM 102, retain the bit of data in the absence of power being provided to the SRAM cell 102, and return the bit of data to the SRAM cell 102 when power is restored. For example, if there is a possibility of power to the SRAM cell 102 being lost, the bit of data can be transferred from the SRAM cell 102 to the nv cell 101 in a store operation. At a later time, the bit of data can be returned from the nv cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. Typical nvSRAM memory arrays are comprised of 1,048,576 nvSRAM cells. The motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (an array of 1024×1024). The area occupied by a memory chip is important because many applications for the chip, such as personal computers, are continually attempting to provide more memory in less space.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, writing and reading. In the standby state, the circuit is idle waiting for a read or a write operation to occur. In stand-by mode operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the write state, the contents of SRAM cell 102 is updated. The write cycle begins by applying the value to be written to the bit lines BT 107 and BC 106. Assume, for example, the dt 175 is at a logic level 1 and dc 180 is at a logic level 0. If a logic 0 is desired to be written, then bit line BT 107 is taken to ground while BC 106 is pre-charged to Vcc. Upon asserting the word line, the high node dt 175 inside the SRAM cell 102 gets discharged through transistor 165 to ground and the cell flips its state, thus writing a logic 0 into the cell. Ron we should first put the write and then the read.

In the read state, data within SRAM cell 102 is requested. Assume for purposes of explanation that the contents of the memory of SRAM cell 102 is a 1 stored at dt 175 and a 0 stored at dc 180. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BT at its pre-charged value and discharging BC through transistor 170 and transistor 160. On the BT side, transistor 165 is cutoff because the VGS on this transistor equals 0V, and thus BT remains pre-charged at logic 1. If, however, the contents of the memory of SRAM cell 102 was a logic 0, the opposite would happen and BC would be pulled towards a logic 1 and BT would discharge through transistor 165 and transistor 155.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one bit of memory.

Access to each cell is enabled by the word line (WL) 121 that controls the two transistors 165, 170. Transistors 165, 170 control whether the cell should be connected to the bit lines BT 107 and BC 106. Transistors 165, 170 are also used to transfer data onto the bit-lines for both the read and write operations. Two bit lines BT and BC are not required, however, both the true signal and the compliment of that signal provide improved noise margins.

Generally, as illustrated in FIG. 1, nvSRAM cell 100 comprises a plurality of n-channel, Field-Effect Transistors (FETs); a plurality of nonvolatile elements, such as nonvolatile transistors or capacitors; and a plurality of resistors. It should, however, be appreciated that other types of transistors, such as p-channel FETs, and combinations of different types of transistors can be utilized.

As shown in FIG. 1, transistor mpdt 145 and mndt 155 form the first inverter and transistors mndc 160 and mpdc 150 form the second inverter. The output of the first inverter dt 175 is coupled to the input of the second inverter and the output of the second inverter dc 180 is coupled to the input of the first inverter. The configuration of the first and second inverters form the latch in the SRAM cell 102. There are two pass transistors mnbt 165, mnbc 170 that are driven by the signal WL 121. The first pass transistor mnbt 165 connects the bit line BT 107 to the data true node 175 and the second pass transistor mnbc 170 connects the bit-line complement BC 106 to the data complement node dc 180.

The nonvolatile portion 101 includes a first silicon oxide nitride oxide semiconductor (SONOS) FET 110 and a second SONOS FET 125 for respectively storing the state of the SRAM cell 102. The state of SRAM cell 102 is stored in the first and second SONOS FETs 110, 125 by performing a store operation. Ron we need to see what I wrote in the other patents. For example, if the first SRAM FET 155 is in an OFF state and the second SRAM FET 160 is in an ON state, the store operation would reflect this state of the first and second SRAM FETs 155, 160 by forcing the threshold voltage for turning ON the first SONOS FET 110 to be less than the threshold voltage for turning ON the second SONOS FET 125. This forcing is accomplished by appropriately cycling a $V_{SE}$ signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 0V and a HIGH signal is approximately 1.8V during a store operation.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation. The first and second recall transistors 105, 120 are turned OFF during a store operation. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (illustrated in FIG. 2).

Figure 2:
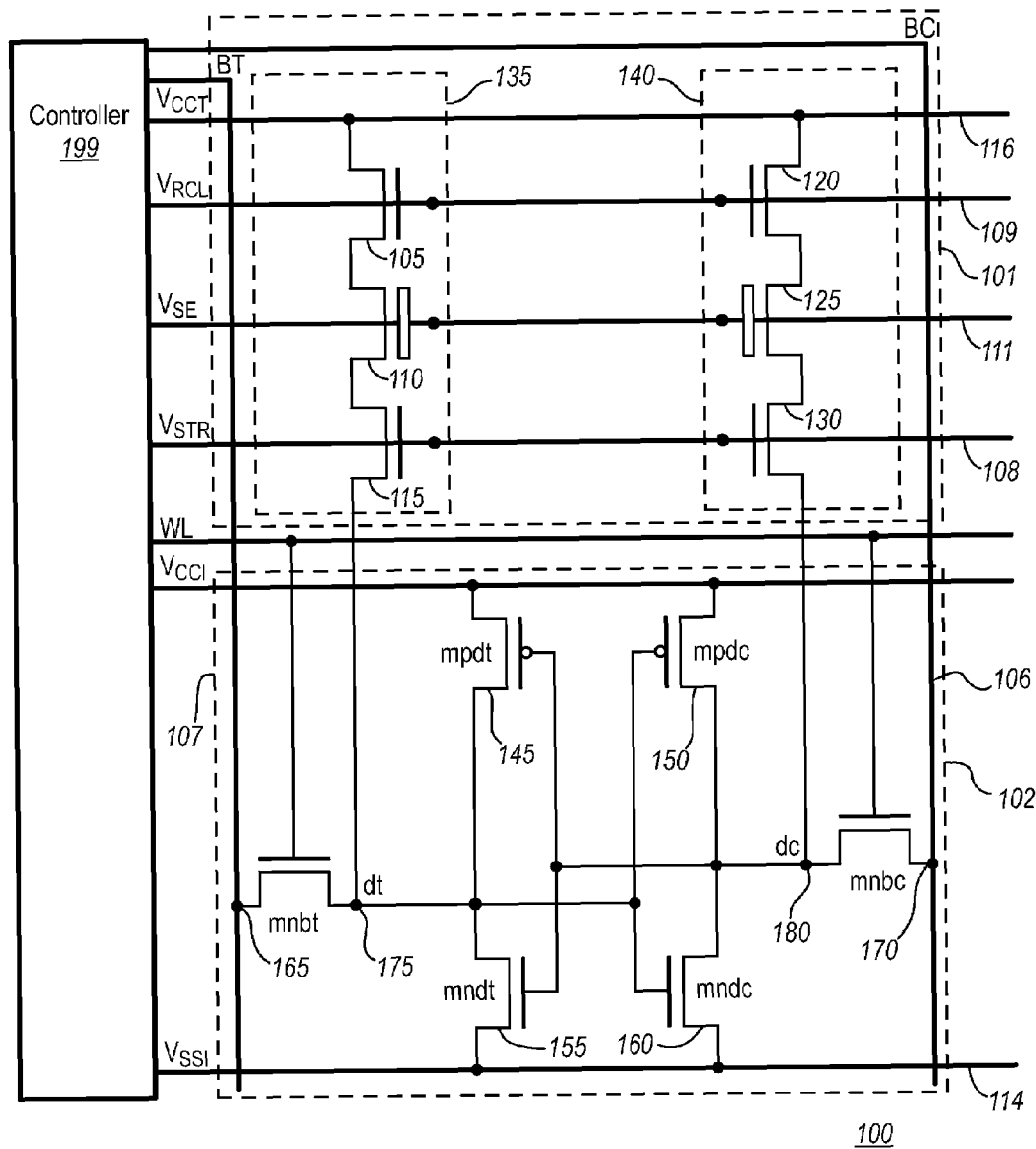
FIG. 2 is a schematic diagram illustrating an nvSRAM memory cell of FIG. 1 with an attached controller.

As illustrated in FIG. 2, a controller 199 is included in the nvSRAM device 100 for (1) providing signals to SRAM cell 102 to transfer a bit of data between the SRAM cell 102 and the exterior environment; (2) providing signals to the SRAM cell 102 and the non-volatile portion 101 to copy a bit of data from the SRAM cell 102 into the non-volatile portion 101, i.e., cause a store operation to be performed; and (3) providing signals to the SRAM cell 102 and the non-volatile portion 101 to copy a bit of data from the non-volatile portion 101 to the SRAM cell 102, i.e., cause a recall operation to be performed. The controller 199 performs the noted operations based upon signals received from a device, typically a microprocessor, that is located exterior to the nvSRAM device 100. For example, if a microprocessor required the bit of data stored in the SRAM 102, it would issue a command to the controller 199. In response, the controller 199 would provide the signals to the SRAM cell 102 to cause the bit of data in the SRAM cell 102 to be transferred to the exterior environment.

The controller also performs certain operations without direction from a microprocessor. For instance, the controller 199 is capable of independently sensing when power is initially being applied to the device 100 and, in response, causing a recall operation (power-up recall operation) to be performed. Conversely, the controller 199 is capable of sensing when power is being removed from the device 100 and, in response, causing a store operation (power-down store operation) to be performed. The non-volatile memory cell in the non-volatile portion 101 to which the bit of data in the SRAM cell 102 is transferred in the case of a power-down and the non-volatile memory cell in the non-volatile portion 101 from which a bit of data is recalled in the event of a power-up is established in the nvSRAM 100 during manufacture. Alternatively, the nvSRAM 100 is designed to allow the user to configure stores or recalls on the non-volatile memory cells. This configurability can be achieved via a command that is issued to the nvSRAM 100 or any of the other ways known in the art.

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 121, is raised to approximately 1.8V to turn on the pass transistor gates 165, 170 and the data is read or written differentially through the bit lines, BT 107 and BC 106. The transfer of data from the volatile section 102 to the non-volatile section 101, i.e. a STORE operation, takes place in two steps, during which the word line, WL 121, is OFF or at 0V (i.e., ground).

During the first step, the erase portion of the STORE cycle, nonvolatile control lines $V_{STR}$ 108 and $V_{RCL}$ 109 remain low or OFF, which is typically 0V. Then, non-volatile transistor gate of SONOS transistors 110, 125 is pumped down to a negative super-voltage through node $V_{SE}$ 111 sufficient to positively charge the nitride dielectric through direct tunneling across the ultra-thin tunnel oxide. In a typical arrangement, the negative super-voltage is approximately equal to −10V. Node $V_{SE}$ 111 is held at the negative super-voltage long enough to convert all the threshold voltages, $V_T$, of all the nitride transistors in the array to equal depletion values. The erase portion of the STORE cycle is completed by discharging $V_{SE}$ back to ground.

To program the non-volatile SRAM from the data in the volatile SRAM, assuming that the last SRAM write has left a logic "1," which leaves the data true node of the SRAM cell at 1.8V and the data complement node at a logic level 0. With the word line 121 to the SRAM cell 102 at ground, and the bit line pairs BT 107 and BC 106 maintained at 1.8V, the VSTR signal that gates the first and second store transistors is turned ON by raising VSTR to 1.8V. Next, a programming pulse and programming voltage of approximately 10V is applied on VSE, which gates the first and second SONOS transistors. The store transistor with its gate and source voltage both at 1.8V is cutoff, while the store transistor with its gate voltage 1.8V and its source voltage at 0V is ON and puts the 0V on the source node of the SONOS transistor on the dc side of the SRAM cell. This SONOS transistor gets programmed as electrons tunnel into the nitride and get stored, thus raising the threshold voltage of the SONOS transistor on the dc side of the SRAM cell. The SONOS transistor on the dt side of the SRAM cell stays erased as its source and drain node couple up with the VSE voltage. Thus, a depletion transistor and an enhancement mode transistor are formed on both sides of the trigate.

The RECALL cycle begins by clearing the existing SRAM data, first by discharging the bit lines, BT 107 and BC 106 to ground, clamping VCCI to VSSI and then by turning on the word line, WL 121. With word line 1210N and the bit lines BT 107 and BC 106 at ground, the data nodes dt 175 and dc 180 are discharged to ground. The word line 121 is then returned to ground. Both nodes $V_{STR}$ and $V_{RCL}$ are turned on, providing a charging path to the internal nodes of the volatile section 102 through the nonvolatile section 101 to the power supply. With nonvolatile gate, $V_{SE}$, held at ground and assuming the last STORE operation left SONOS transistor 110 erased and SONOS transistor 125 programmed, and assuming that the erase threshold is −1V and the program threshold is +1V, the SONOS transistor 110 will conduct current while the SONOS transistor 125 will not because its gate voltage is below its VT.

Node dt 175 charges up high, while node dc 180 remains low, thereby reestablishing the data corresponding to the last STORE cycle as explained above. The RECALL operation is completed by powering up the SRAM and returning all control lines to their default states.

Figure 3:
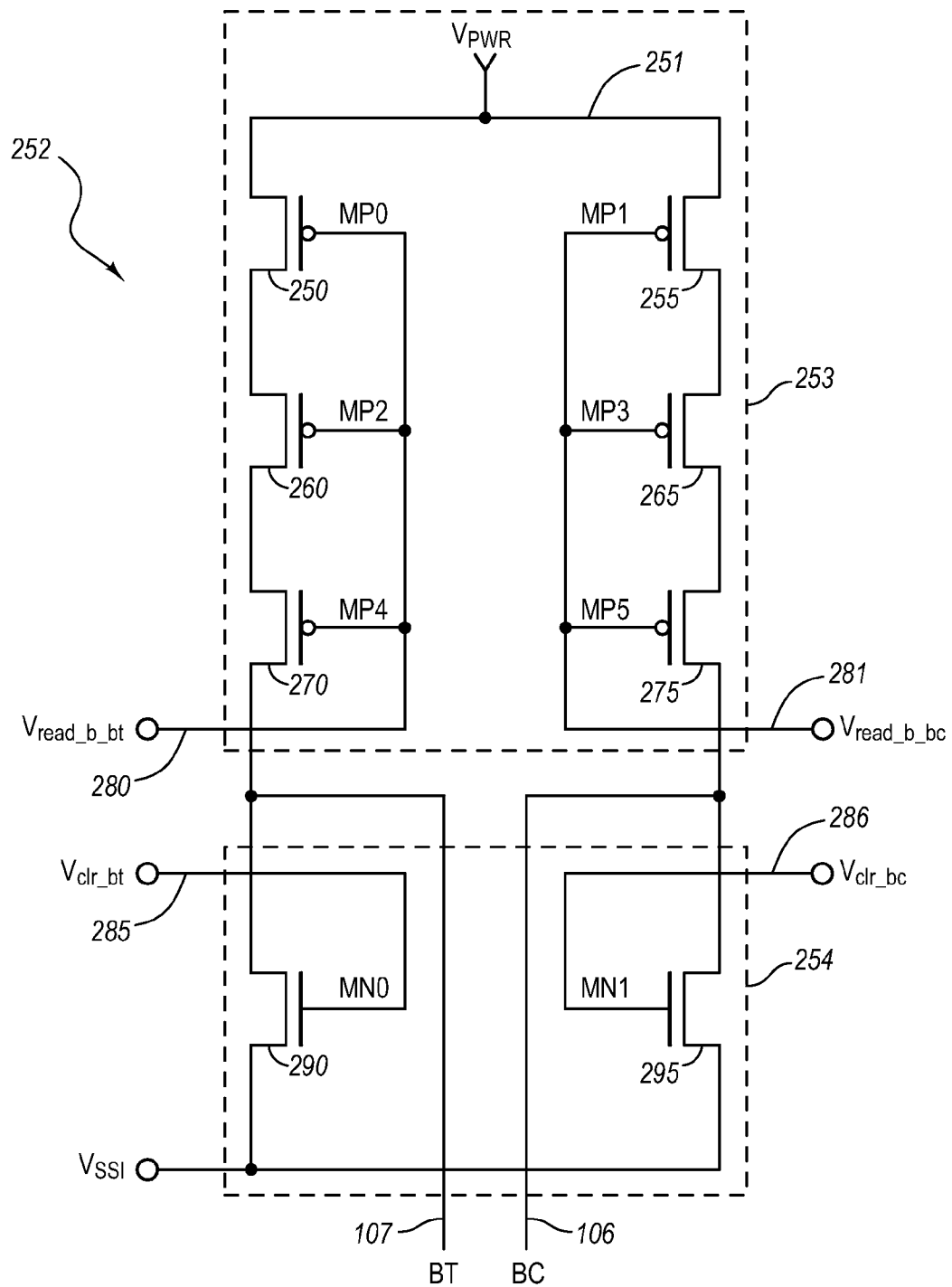
FIG. 3 is a schematic diagram illustrating an array reset circuit.

In accordance with the present invention, FIG. 3 illustrates an array reset circuit 252 for controlling each bit line in a bit line pair. Array reset circuit 252 is capable of independently operating bit lines BT 107 and BC 106. In other words, array reset circuit 252 may independently drive the state of bit line BT 107 either HIGH or LOW—which in the present invention is 1.8V or 0.0V respectively—without regards for the state of bit line BC 106. At the same time, bit line BC 106 may be driven HIGH or LOW, and the state of bit line BT 107 has no effect.

Array reset circuit 252 is comprised of a first circuit portion 253 and a second circuit portion 254. First circuit portion 253 has a first plurality of series connected p-channel transistors 250, 260, 270 and a second plurality of series connected p-channel transistors 255, 265, 275 that act as a load for the bit lines BT 107 and BC 106 respectively. The sources of transistor 250 and transistor 255 are connected to a power source $V_{PWR}$ 251. The drains of transistors 270 and transistor 275 are connected to the BT 107 and BC 106 respectively and keep the bit-lines pre-charged to VPWR 251. The gates of transistors 250, 260, 270 are connected together and coupled to node $V_{read\_b\_bt}$. The gates of transistors 255, 265, 275 are connected together and coupled to node $V_{read\_b\_bc}$. Second circuit portion 254 has a first n-channel transistor 290 and a second n-channel transistor 295 that couple the bit lines BT 107 and BC 106 to ground node $V_{SSI}$. The gate of transistor 290 is coupled to $V_{clr\_bt}$, the source is connected to ground node $V_{SSI}$ and the drain is coupled to BT 107. The gate of transistor 295 is coupled to $V_{clr\_bc}$, the source is connected to ground node $V_{SS}$, and the drain is coupled to BC 106.

Figure 6:
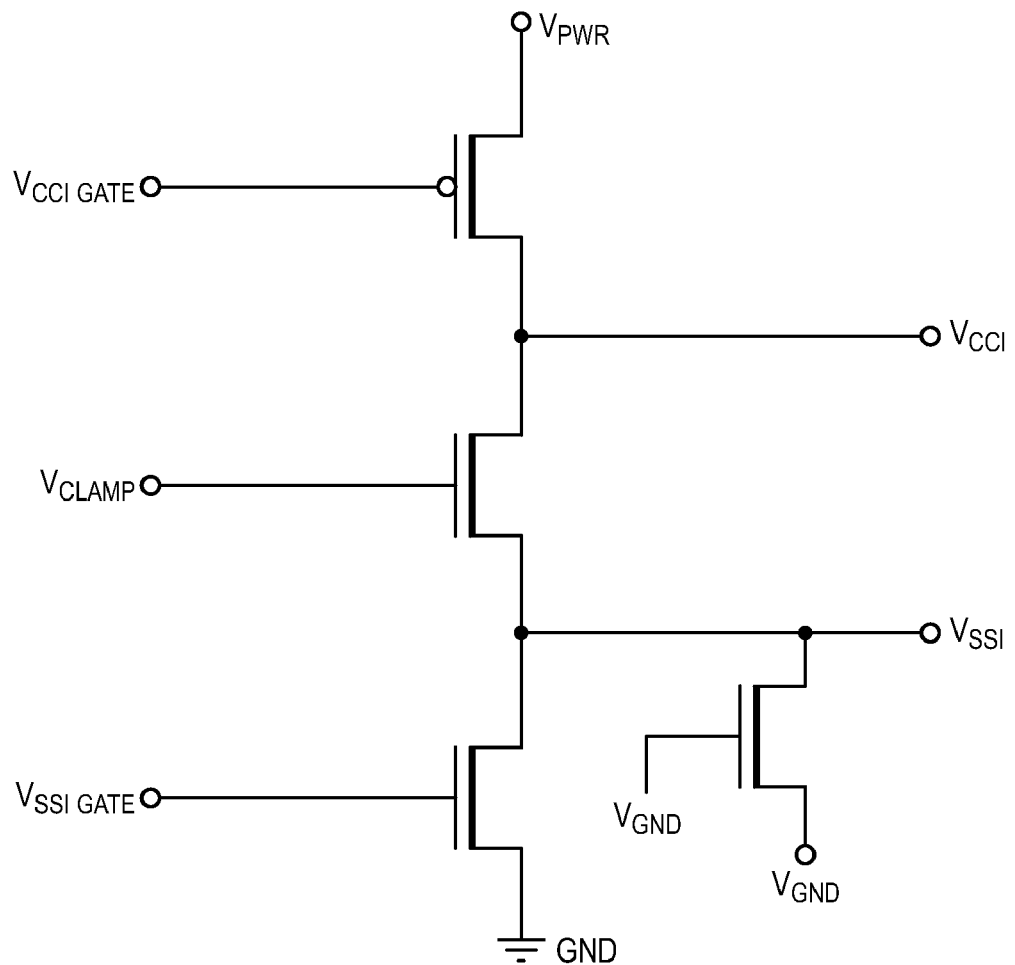
FIG. 6 illustrates the clamp transistor that operates to clamp $V_{CCI}$ to $V_{SSI}$.

In an operation for grounding and energizing the bit lines, $V_{CCI}$ and $V_{SSI}$ in memory cell 100 are clamped close to chip ground $V_{SS}$, shown in FIG. 6. During normal SRAM operation, $V_{read\_b\_bt}$ and $V_{read\_b\_bc}$ are held at ground (0V) and $V_{clr\_bt}$ and $V_{clr\_bc}$ are held at 0V, thus enabling the bit-lines to be pre-charged to VPWR 251. A single bit line, for purposes of illustration bit line BC 106, may be driven LOW or to chip ground. Accordingly, $V_{read\_b\_bc}$ 281 and $V_{clr\_bc}$ 286 are maintained HIGH and $V_{read\_b\_bt}$ 280 and $V_{clr\_bt}$ 285 are maintained LOW. Driving $V_{read\_b\_bc}$ 281 and $V_{clr\_bc}$ 286 HIGH turns OFF the series connected p-channel transistors 255, 265, 275 and turns the n-channel transistor 295 to an ON state. Accordingly, bit line BC 106 is connected to ground node $V_{SS}$, and thus driven LOW to chip ground. Driving $V_{read\_b\_bt}$ 280 and $V_{clr\_bt}$ 285 LOW turns ON the series connected p-channel transistors 250, 260, 270 and turns the n-channel transistor 290 OFF. The series connected p-channel transistors become a load for bit Line BT 107 and thus energize BT 107 to a HIGH state.

Figure 4:
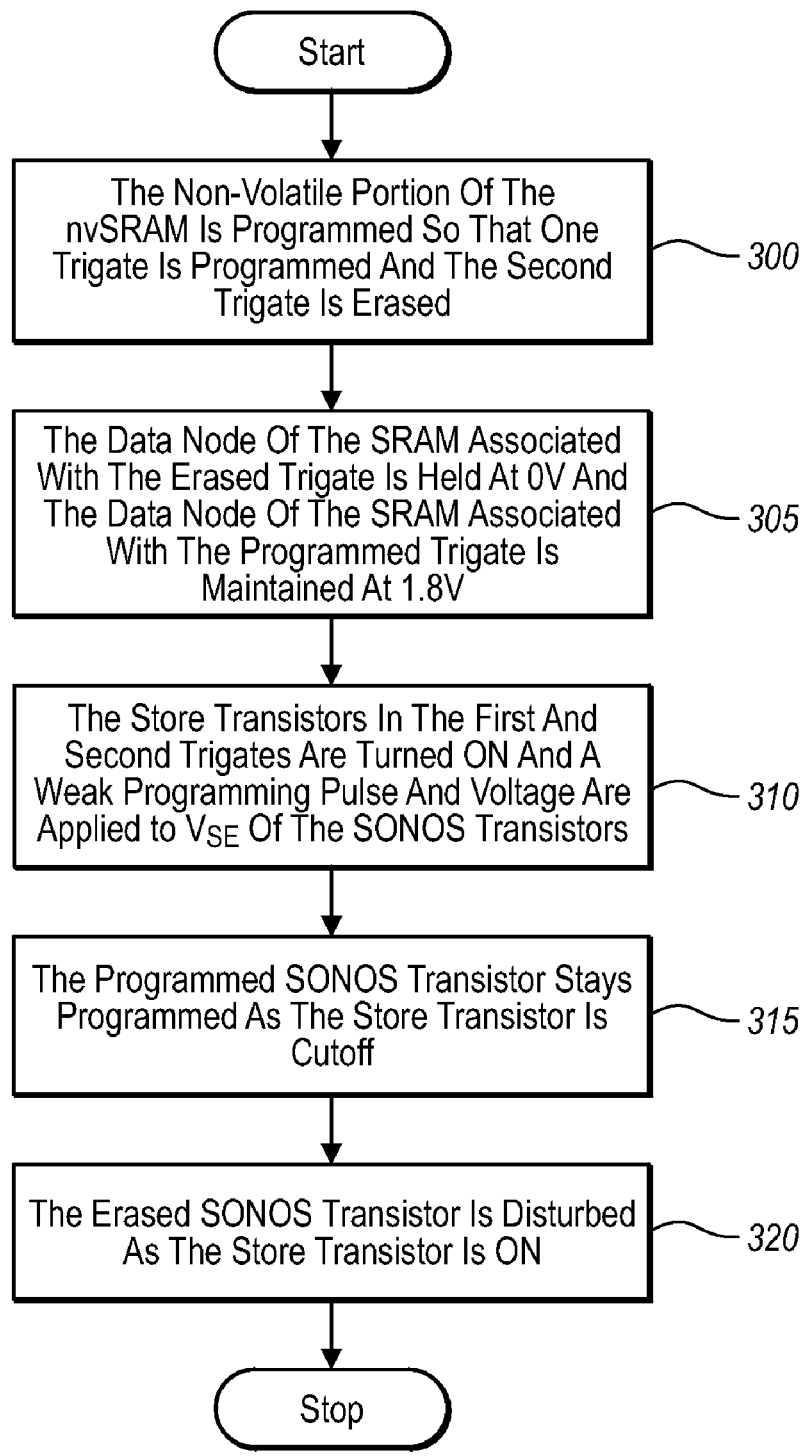
FIG. 4 is a flow chart illustrating a prior method of creating an erase disturb of a SONOS transistor in a nvSRAM cell.

FIG. 4 illustrates a previous method by way of a flow chart showing the various steps for creating a disturb of an erased SONOS transistor in a nvSRAM cell. The method will be further described with reference to the schematic diagram of FIGS. 2 and 3. The non-volatile portion 101 of the nvSRAM cell 100 is programmed in step 300 so that a first trigate 135 is erased and the second trigate structure 140 is programmed in accordance with the description above. In step 305, the data node dt 175 of the SRAM portion 102 that is associated with the first trigate 135 is held LOW at 0V or ground. At the same time, the data node dc 180 of the SRAM portion 102 that is associated with the second trigate structure 140 is maintained at a HIGH or 1.8V. The store transistors 115, 130 in the first and second trigate structures are turned ON in step 310 and a weak programming pulse and programming voltage are applied to the $V_{SE}$ node coupled to the gates of the SONOS transistors 110, 125. Since $V_{GS}$=0V for the store transistor 130 coupled to the SONOS transistor 125, the second trigate structure 140 remains programmed. Since the VGS is greater than 0V for the store transistor 115, the store transistor is ON and the erased SONOS transistor 110 is disturbed.

Figure 5:
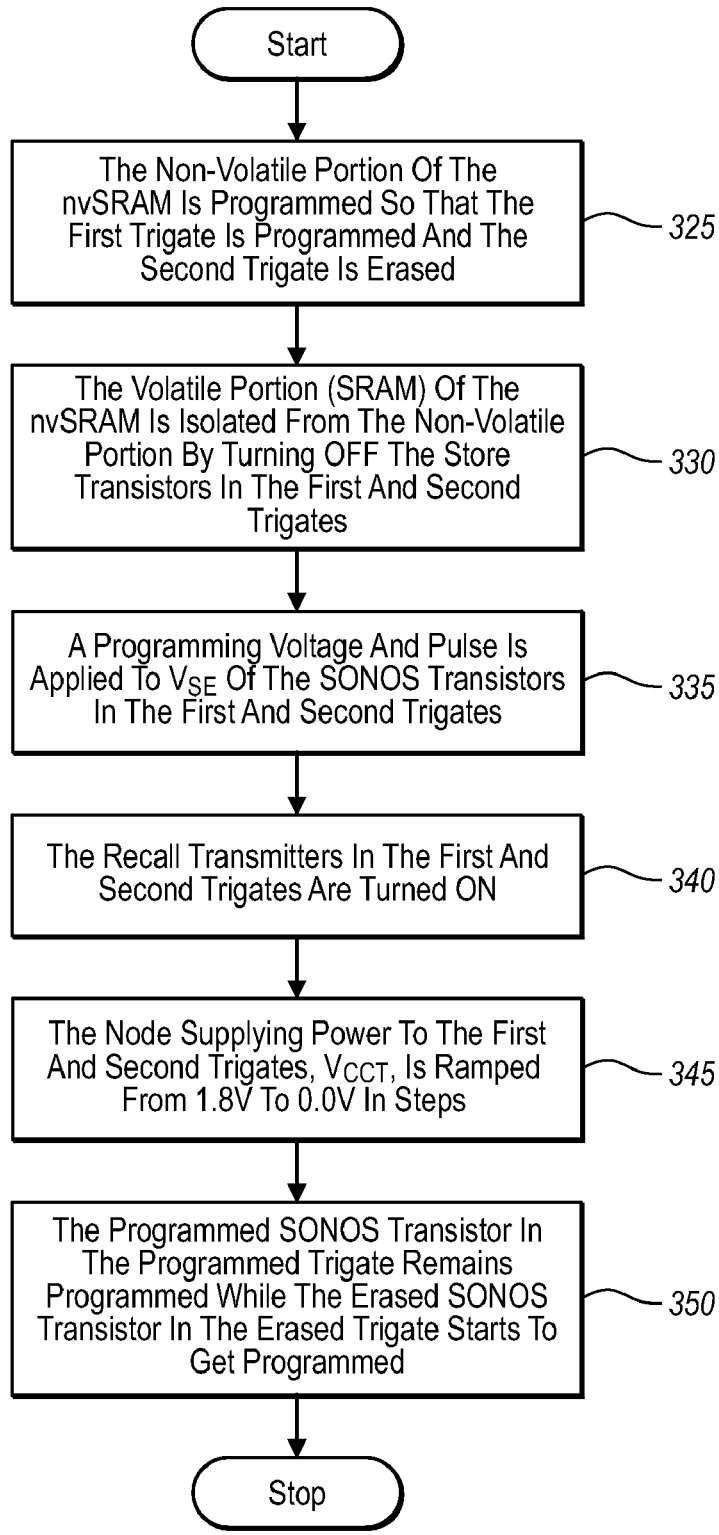
FIG. 5 is a flow chart showing the various steps of the present invention for creating an erase disturb of a SONOS transistor in a nvSRAM cell.

FIG. 5 illustrates the method of the present invention by way of a flow chart showing the various steps for creating an erase disturb of a SONOS transistor in a nvSRAM cell. The method will be further described with reference to the schematic diagram of FIGS. 2 and 3. The non-volatile portion 101 of the nvSRAM cell 100 is programmed in step 300 so that a first trigate structure 140 is programmed and a second trigate structure 135 is erased. In step 330, the SRAM portion 102 is isolated from the first and second trigate structures 135, 140 in non-volatile portion 101 in step by turning OFF the store transistors 115, 130. Typically, store transistors 115, 130 are turned OFF by maintaining approximately 0V (or grounding) on the $V_{STR}$ node coupled to the gate of each store transistor. A programming pulse and programming voltage are then applied in step 335 to the $V_{SE}$ node 111 coupled to the gates of the SONOS transistors 110, 125 in the first and second trigates 135, 140. In step 340, the recall transistors 105, 120 are turned ON by typically applying a voltage to the $V_{RCL}$ node 109 coupled to the gates of the recall transistors 105, 120.

Figure 7:
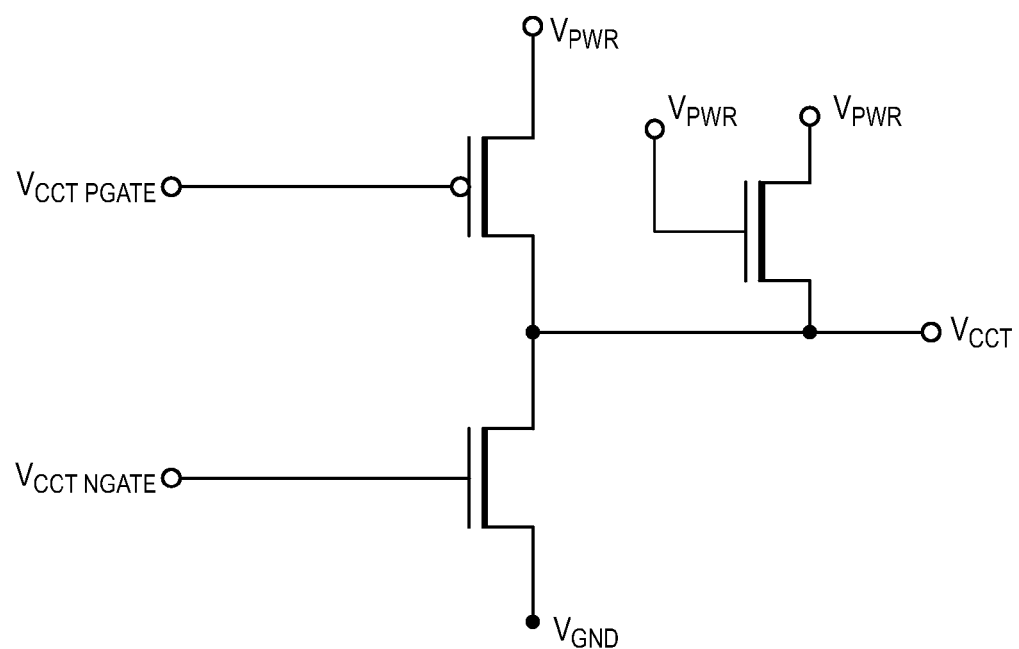
FIG. 7 illustrates a discharge transistor for grounding the $V_{CCT}$ node.

As shown in step 345, the node supplying power to the first trigate structure 140 and the second trigate structure 135—i.e., $V_{CCT}$ 116—is ramped downward from 1.8V to ground or 0V. The voltage may be ramped using a $V_{CCT}$ discharge transistor shown in FIG. 7. The programmed SONOS transistor 125 in the programmed trigate 140 remains programmed in step 350, while the erased SONOS transistor 110 in the erased trigate 135 starts to get programmed thus creating an erase disturb on SONOS transistor 110.

Accordingly, only one side of the trigate gets programmed while the other side stays erased or write inhibited. This process is a useful method of disturbing the erase SONOS transistor to see the extent to which it gets programmed while maintaining the program SONOS transistor in a programmed state. As the stored data is recalled into the volatile portion or SRAM, a differential current in the two trigate structures establishes the differential voltage inside the volatile SRAM to recall the correct data. Ideally it would be beneficial to only have the erased SONOS transistor conduct, as it is a depletion mode transistor having a more negative threshold, while the programmed transistor should be off as it has a more positive threshold voltage. In an array of 1 Mb to 4 Mb cells, there might be some tail bits which may have their erased SONOS thresholds slightly more positive than expected, and this may cause the SONOS window for the program SONOS transistor and the erase SONOS transistor to be small. The present invention assists in determining the extent of the erase SONOS transistor so as to determine the SONOS window for the program SONOS transistor threshold voltage and the erase SONOS transistor threshold voltage, especially on the tail bits in an array of 1 Mb to 4 Mb nvSRAM cells.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

We claim:

1. A method for disturbing a first tri-gate structure in an erased condition while a second tri-gate structure remains programmed in a non-volatile SRAM cell having a volatile portion and a non-volatile portion, each tri-gate structure in said non-volatile portion having a recall transistor, a store transistor and a SONOS transistor, said volatile portion having an SRAM cell comprising a word line, a node supplying power to said SRAM cell and a bit line pair with a first bit line and a second bit line, said method comprising:

erasing said first and second SONOS transistors associated with said non-volatile portion of said SRAM cell;

programming said first and second SONOS transistors so that said first tri-gate having said first SONOS transistor is configured in an erased condition and said second tri-gate structure having said second SONOS transistor is configured in a programmed condition;

isolating said volatile portion from said non-volatile portion by turning off a first store transistor in said first tri-gate structure and turning off a second store transistor in said second tri-gate structure;

applying a programming pulse and a programming voltage to said first and second SONOS transistors in said first and second tri-gate structures;

applying a voltage to each recall transistor in said first and second tri-gate structure sufficient to turn each recall transistor on; and ramping a supply voltage to said first and second tri-gate structure from a first voltage to approximately ground, wherein said second tri-gate structure remains in said programmed condition and wherein said first tri-gate structure transition from said erased condition to a programmed condition.

2. The method of claim 1, wherein said first voltage is 1.8V.

3. The method of claim 1, wherein said step of ramping said supply voltage is performed by a $V_{CCT}$ discharge transistor.

* * * * *